(12) United States Patent
Yin

(10) Patent No.: US 11,493,810 B2
(45) Date of Patent: Nov. 8, 2022

(54) DISPLAY PANEL AND METHOD OF FABRICATING SAME

(71) Applicant: WUHAN CHINA STAR OPTOELECTRONICS TECHNOLOGY CO., LTD., Hubei (CN)

(72) Inventor: Bingkun Yin, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/623,720

(22) PCT Filed: Oct. 21, 2019

(86) PCT No.: PCT/CN2019/112117
§ 371 (c)(1),
(2) Date: Sep. 24, 2021

(87) PCT Pub. No.: WO2021/000457
PCT Pub. Date: Jan. 7, 2021

(65) Prior Publication Data
US 2022/0011637 A1 Jan. 13, 2022

(30) Foreign Application Priority Data
Jul. 2, 2019 (CN) .......................... 201910590304.0

(51) Int. Cl.
*G02F 1/1345* (2006.01)
*G02F 1/1362* (2006.01)
*H05K 1/18* (2006.01)

(52) U.S. Cl.
CPC ........ *G02F 1/13452* (2013.01); *G02F 1/1345* (2013.01); *G02F 1/136222* (2021.01);
(Continued)

(58) Field of Classification Search
CPC ............... G02F 1/1345; G02F 1/13452–13458
See application file for complete search history.

(56) References Cited

U.S. PATENT DOCUMENTS 10,192,896 B2 * 1/2019 Kim ..................... G02F 1/1345
2013/0148072 A1 6/2013 Jang et al.
(Continued)

FOREIGN PATENT DOCUMENTS

| CN | 105144418 A | 12/2015 |
| CN | 108922877 A | 11/2018 |

(Continued)

*Primary Examiner* — Dung T Nguyen
(74) *Attorney, Agent, or Firm* — Geoffrey Lottenberg; Berger Singerman LLP

(57) ABSTRACT

A display panel and a fabricating method thereof are provided. The display panel is provided with a bending region and a non-bending region. The display panel has a flexible substrate, a first line layer, an insulating layer, and a second line layer, which are layer-stacked. The first line layer has first lines. The insulating layer corresponding to each of the first lines is provided with at least two through holes penetrating the insulating layer. The through holes are defined at two ends of the bending region adjacent to the non-bending region. The second line layer has second lines. The second lines are aligned with the first lines in a one-to-one manner. The second lines extend and penetrate the through holes to electrically connect to the first lines. The fabricating method has steps: providing a flexible substrate, fabricating a first line layer, an insulating layer, a second line layer.

10 Claims, 3 Drawing Sheets

(52) U.S. Cl.
CPC ........ *G02F 1/136286* (2013.01); *H05K 1/189* (2013.01); *H05K 2201/10136* (2013.01)

(56) References Cited

U.S. PATENT DOCUMENTS

2014/0217397 A1    8/2014  Kwak et al.
2014/0361262 A1*  12/2014  Kim ...................... H01L 27/326
                                                                                                                          257/40

FOREIGN PATENT DOCUMENTS

| CN | 109148541 A | 1/2019 |
|---|---|---|
| CN | 109240013 A | 1/2019 |
| CN | 109658829 A | 4/2019 |
| CN | 109658831 A | 4/2019 |
| CN | 110335875 A | 10/2019 |

* cited by examiner

DISPLAY PANEL AND METHOD OF FABRICATING SAME

CROSS-REFERENCE TO RELATED APPLICATIONS

This application is the National phase under 35 U.S.C. § 371 of International Application No. PCT/CN2019/112117, filed Oct. 21, 2019, which claims the benefit of and priority to Chinese Patent Application No. 201910590304.0, filed Jul. 2, 2019. The entire contents of these patent applications are hereby incorporated by reference herein.

FIELD OF DISCLOSURE

The present disclosure relates to displays, and more particularly to a display panel and a method of fabricating the same.

BACKGROUND OF DISCLOSURE

In a current mobile terminal market, design requirements for high-screen ratios are getting higher and higher. How to compress borders of non-display regions on the liquid crystal display design has become focus of various manufacturers' designs. The design of folding the non-display region back to a side surface or a back surface of the display screen has become a hot spot for the designs with the current high-screen ratios.

Since base material of a thin film transistor (TFT) and a color film substrate (CF) is made of soft materials such as polyimide (PI) or polyethylene terephthalate (PET), which are bendable, deformable, and flexible, a liquid crystal display is relatively easy to realize the non-display region being folded back, but a metal electrode of the current design is a layer, which is prone to breakage of the metal electrode when bending, which affects signal transmission.

Therefore, a technical problem to be solved by those skilled in the art is how to provide a novel display panel and a method of fabricating the same to reduce a risk of cracking or breaking of the metal electrode.

SUMMARY OF DISCLOSURE

An object of the present disclosure is to provide a display panel and a method of fabricating the same, which solves problems of cracking or breaking of a metal electrode in a bending region.

To solve the above problems, an embodiment of the present disclosure provides a display panel provided with a bending region and a non-bending region located at two sides of the bending region. The display panel comprises a flexible substrate, a first line layer, an insulating layer, and a second line layer, all of which are layer-stacked. Specifically, the first line layer is disposed on a surface of the flexible substrate. The first line layer comprises a plurality of first lines. The insulating layer is disposed on a surface of the first line layer facing away from the flexible substrate. The insulating layer corresponding to each of the first lines is provided with at least two through holes penetrating the insulating layer. The at least two through holes are defined at a position of two ends of the bending region adjacent to the non-bending region. The second line layer is disposed on a surface of the insulating layer located in the bending region, wherein the surface of the insulating layer located in the bending region faces away from the first line layer. The second line layer comprises a plurality of second lines. The second lines are aligned with the first lines in a one-to-one manner. The second lines extend and penetrate the through holes to electrically connect to the first lines.

Further, the flexible substrate comprises a flexible base layer and a buffer layer. The buffer layer is disposed on a side of the flexible layer facing towards the first line layer.

Further, an organic layer is further disposed between the insulating layer and the second line layer, wherein the through holes penetrate the insulating layer and the organic layer, simultaneously.

Further, material of the flexible base layer comprises polyimide.

Further, the non-bending region comprises a display region configured to display. The display region comprises a transparent electrode layer, a liquid crystal layer, and a color filter substrate, all of which are layer-stacked. Specifically, the transparent electrode layer is disposed on a surface of the insulating layer facing away from the first line layer. The liquid crystal layer is disposed on a surface of the transparent electrode layer facing away from the insulating layer. The color filter substrate is disposed on a surface of the liquid crystal layer facing away from the transparent electrode layer, wherein the color filter substrate is connected to the transparent electrode layer by a sealant, and the liquid crystal layer is sealed.

Further, the non-bending region comprises a binding region configured to bind an external circuit. The binding region comprises a flexible circuit board electrically connected with the first line layer, wherein the flexible circuit board comprises at least one integrated circuit (IC).

The present disclosure further provides a method of fabricating a display panel, comprising steps of:
  providing a flexible substrate;
  fabricating a plurality of first lines on a surface of the flexible substrate to form a first line layer;
  fabricating an insulating layer on a surface of the first line layer facing away from the flexible substrate, and forming at least two through holes penetrating the insulating layer, wherein the at least two through holes are defined at a position of two ends of the bending region adjacent to the non-bending region; and
  fabricating a plurality of second lines on a surface of the insulating layer located in the bending region to form a second line layer, wherein the surface of the insulating layer located in the bending region faces away from the first line layer, wherein the second lines are aligned with the first lines in a one-to-one manner, and the second lines extend and penetrate the through holes to electrically connect to the first lines.

Further, a step of fabricating the flexible substrate comprises:
  providing a glass substrate, coating a polyimide on the glass substrate, and baking and curing the glass substrate to form the flexible substrate; and
  fabricating a buffer layer on the flexible substrate.

Further, the method further comprises a step of fabricating an organic layer between the step of fabricating the insulating layer and the step of fabricating the second line layer, wherein the step of fabricating the organic layer comprises: fabricating the organic layer on a surface of the insulating layer in the bending region, wherein the surface of the insulating layer in the bending region faces away from the first line layer, and forming the through holes in the organic layer, wherein the through holes penetrate the insulating layer and the organic layer, simultaneously.

Further, the non-bending region comprises a display region configured to display. In the display region, the method further comprises steps of:
  fabricating a transparent electrode layer on a surface of the insulating layer facing away from the first line layer;
  fabricating a color filter substrate by coating, drying, exposing, developing, and solid-baking, and disposing the color film substrate opposite to the transparent electrode layer; and
  filling a liquid crystal layer between the transparent electrode layer and the color filter substrate, and sealing the liquid crystal layer by a sealant.

Beneficial effects of the present disclosure are that: a display panel and a method of fabricating the same are provided, wherein the second line layer is disposed on the flexible substrate in the bending region and is connected to the first line layer of a lower layer through a through hole to transmit signals. The flexible substrate may buffer stress generated by bending of the second line layer when the bending region is bent, and may improve a bending radius of the second line layer in the bending region, thereby avoiding that a local stress is excessively generated due to an excessive deformation of the second line layer, so as to generate cracks or fractures, such that the metal electrode is less likely to be broken when bent.

COMPONENTS IN THE FIGURES ARE IDENTIFIED AS FOLLOWS

1: flexible substrate; 2: first line layer; 3: insulating layer; 4: second line layer; 5: organic layer; 6: transparent electrode layer; 7: liquid crystal layer; 8: color film substrate; 9: flexible circuit board; 10: bending zone; 11: flexible base layer; 12: buffer layer; 20: non-bending region; 21: display region; 22: binding region; 30: through hole; 81: polyimide substrate; 82: color resist layer; 83: protective layer; 100: display panel

DETAILED DESCRIPTION OF PREFERRED EMBODIMENTS

Directional terms mentioned in the present disclosure, such as "upper", "lower", "before", "after", "left", "right", "inside", "outside", "side", etc., are only directions in the figures. The directional terms used herein are used to explain and explain the present disclosure, and are not intended to limit the scope of the disclosure.

In addition, it should also be noted that in some alternative implementations, steps of all methods described herein may occur out of the order. For example, two steps shown as being continuous may be performed substantially concurrently or the two steps may sometimes be performed in a reverse order.

Figure 1:
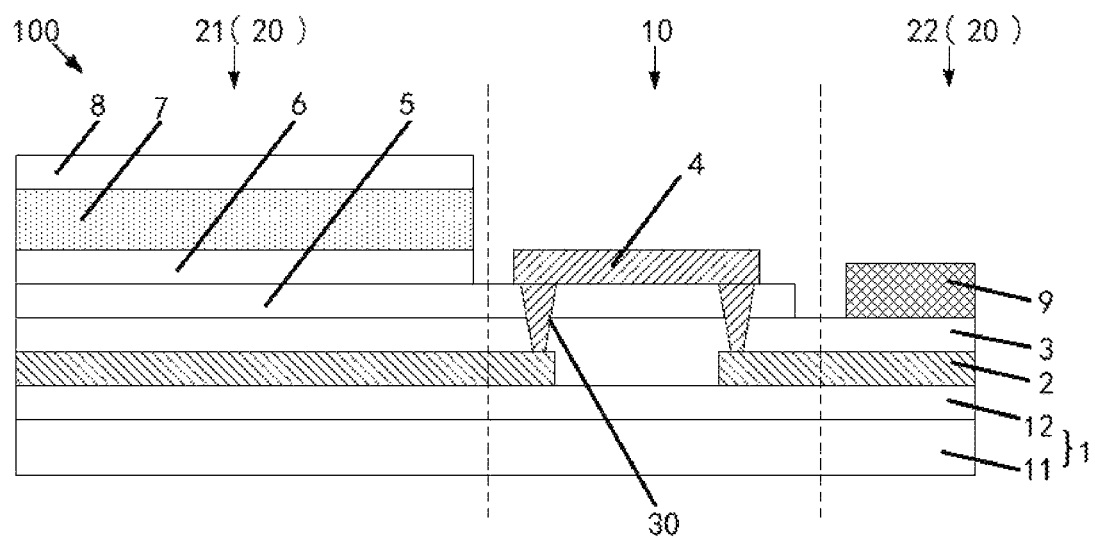
FIG. 1 is a schematic structural view of a display panel according to an embodiment of the present disclosure.
Figure 2:
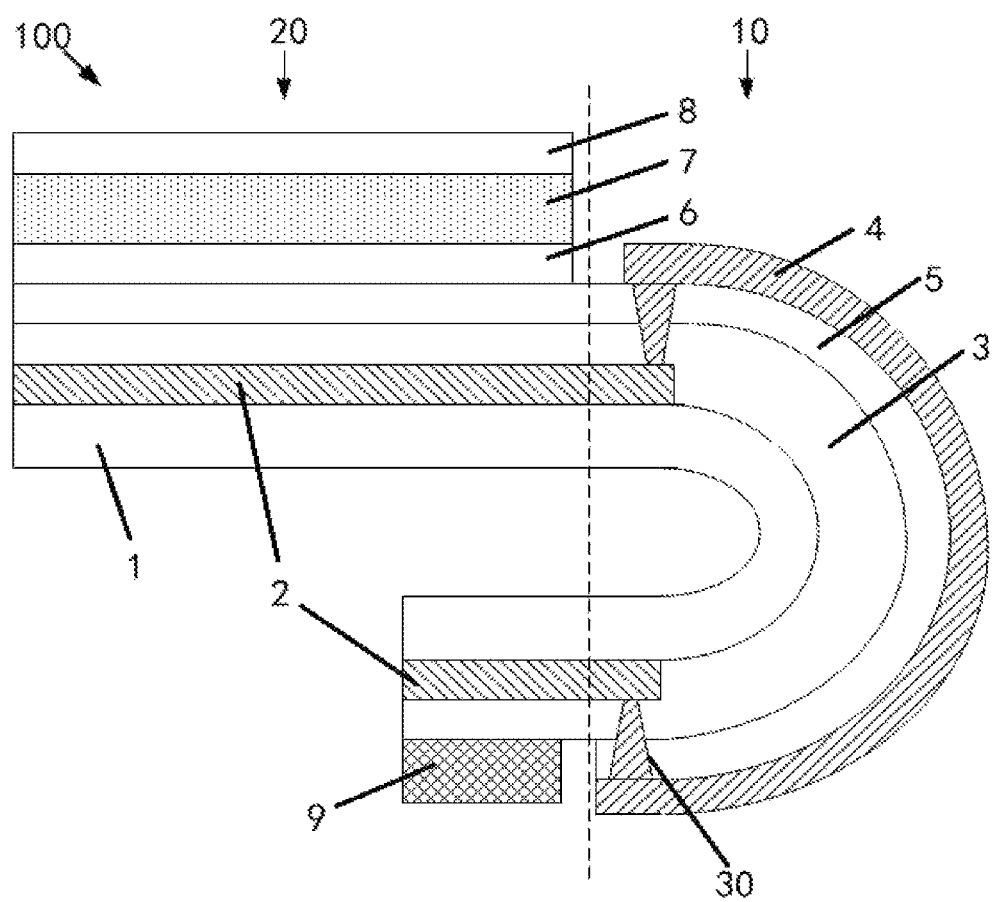
FIG. 2 is a schematic structural view of the present disclosure after the bending region in FIG. 1 is bent.

Referring to FIG. 1 and FIG. 2, an embodiment of the present disclosure provides a display panel 100 which is defined with a bending region 10 and a non-bending region 20 located at two sides of the bending region 10. The bending region 20 includes a display region 21 for display and a binding region 22 for binding an external circuit.

The display panel 100 includes a flexible substrate 1, a first line layer 2, an insulating layer 3, and a second line layer 4, all of which are layer-stacked. Specifically, the first line layer 2 is disposed on a surface of the flexible substrate 1. The first line layer 2 comprises a plurality of first lines. The insulating layer 3 is disposed on a surface of the first line layer 2 facing away from the flexible substrate 1. The insulating layer 3 corresponding to each of the first lines is provided with at least two through holes 30 penetrating the insulating layer 3. The at least two through holes 30 are defined at a position of two ends of the bending region 10 adjacent to the non-bending region 20. Shape of the through holes 30 include one or a combination of a circle, a square, a diamond, and an ellipse. The second line layer 4 is disposed on a surface of the insulating layer 3 located in the bending region 10, wherein the surface of the insulating layer 3 faces away from the first line layer 2. The second line layer 4 comprises a plurality of second lines. The second lines are aligned with the first lines in a one-to-one manner. The second lines fill in the through holes 30 to electrically connect with the first lines, i.e., the second line layer 4 fills in the through holes 30 to electrically connect with the first line layer 2, wherein material of the first line layer 2 and the second line layer 4 is metal.

In the present embodiment, the second line layer 4 is disposed on the flexible substrate 1 in the bending region 10 and is connected to the first line layer 2 of a lower layer through a through hole 30 to transmit signals. That is, the first line layer 2 together with the second line layer 4 form a metal electrode in a bridging manner. The flexible substrate 1 may buffer stress generated by bending of the second line layer 4 when the bending region 10 is bent, and may improve a bending radius of the second line layer 4 in the bending region 10, thereby avoiding that a local stress is excessively generated due to an excessive deformation of the second line layer 4, so as to generate cracks or fractures, such that the metal electrode is less likely to be broken when bent.

Please referring to FIG. 1, in the present embodiment, the flexible substrate 1 comprises a flexible base layer 11 and a buffer layer 12. Specifically, material of the flexible base layer 11 is polyimide. The buffer layer 12 is disposed on a side of the flexible layer 11 facing towards the first line layer 2. Material of the buffer layer 12 is one of SiNx, SiOx, or a stacking combination of both.

In the present embodiment, an organic layer 5 is further disposed between the insulating layer 3 and the second line layer 4, and the through holes 30 penetrate the insulating layer 3 and the organic layer 5, simultaneously.

In the present embodiment, the display region 21 includes a transparent electrode layer 6, a liquid crystal layer 7, and a color filter substrate 8, all of which are layer-stacked. Specifically, the transparent electrode layer 6 is disposed on a surface of the insulating layer 3 facing away from the first line layer 2. Material of the transparent electrode layer 6 includes indium tin oxide (ITO). The color filter substrate 8 is disposed on a surface of the liquid crystal layer 7 facing away from the transparent electrode layer 6. The color filter substrate 8 is connected to the transparent electrode layer 6 by a sealant, and the liquid crystal layer 7 is sealed.

Figure 3:
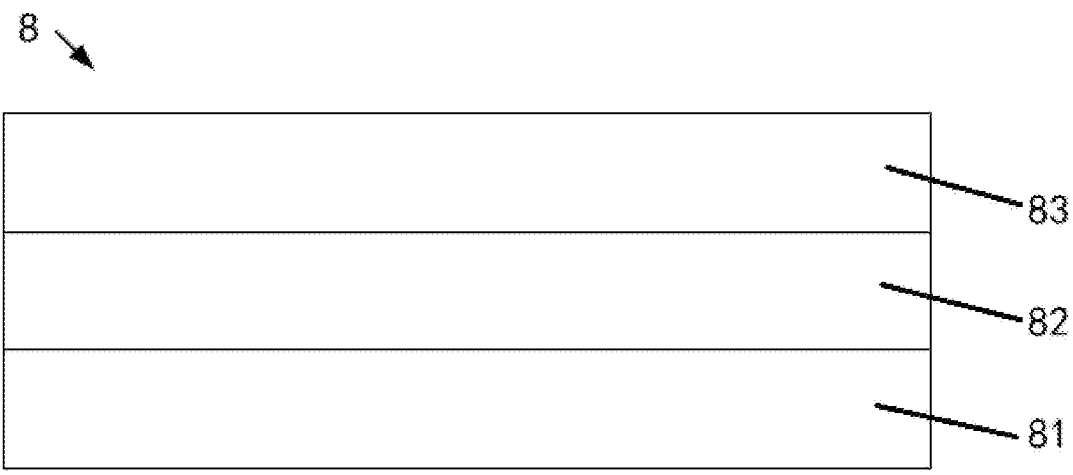
FIG. 3 is a schematic structural view of a color filter substrate according to an embodiment of the present disclosure.

Referring to FIG. 3, the color filter substrate 8 includes a polyimide substrate 81, a color resist layer 82 located on the polyimide substrate 81, and a protective layer 83 located on the color resist layer 82. A side of the protective layer 83 is connected to the liquid crystal layer 7; wherein the color resist layer 82 comprises black matrices and a red color resist, a green color resist, and a blue color resist among the black matrices. It should be noted that the color film substrate 8 is a prior art, and detailed structural features thereof are not described herein, but the description of the structure of the color film substrate 8 provided above is not intended to limit range of the claimed disclosure, but merely represent preferred embodiments of the present disclosure. All other embodiments obtained by those skilled in the art based on the embodiments of the present disclosure without creative efforts are within the scope of the present disclosure.

In present embodiment, the binding region 22 comprises a flexible circuit board 9 electrically connected with the first line layer 2, wherein the flexible circuit board 9 comprises at least one integrated circuit.

Figure 4:
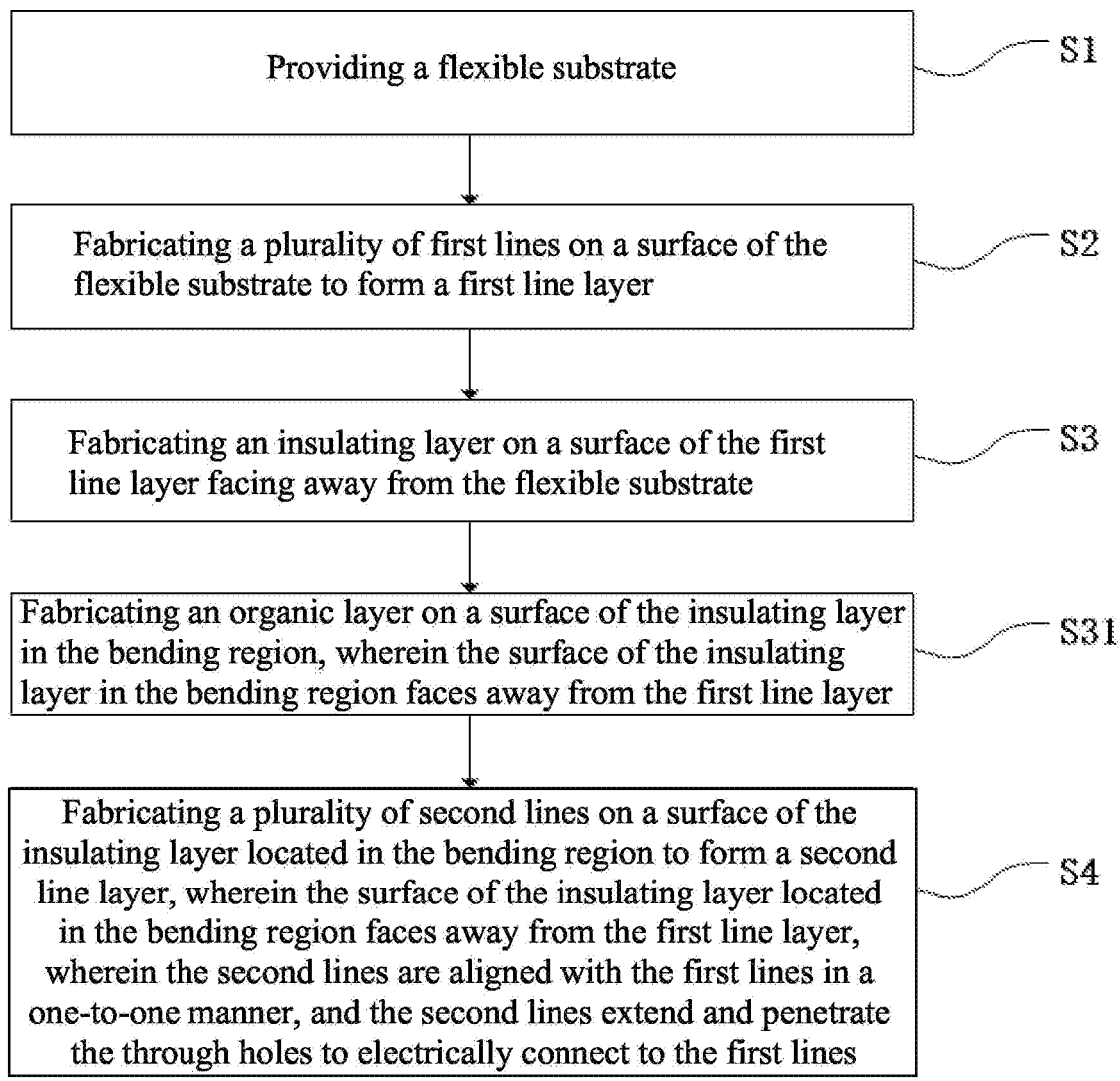
FIG. 4 is a flowchart of fabricating a display panel according to an embodiment of the present disclosure.

Referring to FIG. 4, an embodiment of the present disclosure provides a method for fabricating a display panel 100, comprising steps S1-S4.

In step S1, a flexible substrate 1 is provided.

In step S2, a plurality of first lines are fabricated on a surface of the flexible substrate 1 to form a first line layer 2. Material of the first line layer 2 is metal.

In step S3, an insulating layer 3 is fabricated on a surface of the first line layer 2 facing away from the flexible substrate 1, and at least two through holes 30 penetrating the insulating layer 3 are formed. The at least two through holes 30 are defined at a position of two ends of the bending region 10 adjacent to the non-bending region 20. Shape of the through holes 30 include one or a combination of a circle, a square, a diamond, and an ellipse. A purpose of forming the through holes 30 in the present embodiment is to achieve that the second line layer 4 fills the through holes 30 and is electrically connected to the first line layer 2, and shape of the through holes 30 is not strictly limited.

In step S4, a plurality of second lines are fabricated on a surface of the insulating layer 3 located in the bending region 10 to form a second line layer, wherein the surface of the insulating layer 3 faces away from the first line layer 2, wherein the second lines are aligned with the first lines in a one-to-one manner, and the second lines extend and penetrate the through holes to electrically connect to the first lines. That is, the second line layer 4 extend and penetrate the through holes 30 to electrically connect to the first line layer 2. Material of the second line layer 4 is metal.

Figure 5:
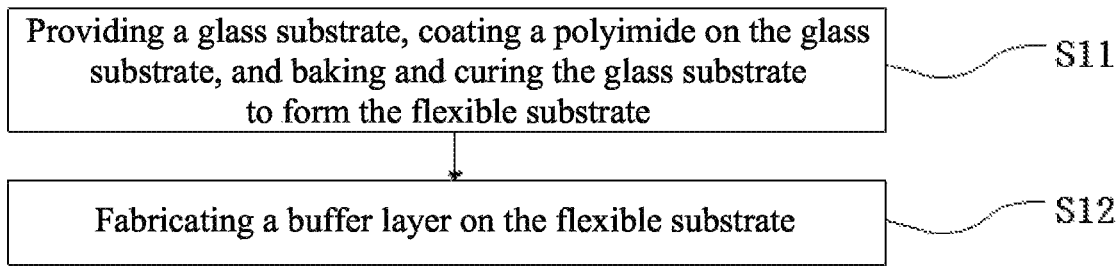
FIG. 5 is a flowchart of fabricating a flexible substrate according to an embodiment of the present disclosure.

Referring to FIG. 5, in the present embodiment, a step of fabricating the flexible substrate 1 comprises steps S11-S12.

In step S11, a glass substrate is provided, a polyimide is coated on the glass substrate, and the glass substrate is baked and cured to form the flexible substrate 1.

In step S12, a buffer layer is fabricated by depositing one of SiNx, SiOx, or a stacking combination of both on the flexible substrate 1 using a chemical vapor deposition method.

Please referring to FIG. 4, in the present embodiment, the method further comprises a step S31 of fabricating an organic layer 5 between the step of fabricating the insulating layer 3 and the step of fabricating the second line layer 4, wherein the step S31 of fabricating the organic layer 5 comprises: fabricating the organic layer 5 on a surface of the insulating layer 3 in the bending region 10, wherein the surface of the insulating layer 3 in the bending region 10 faces away from the first line layer 2, and the through holes 30 are formed in the organic layer 5, wherein the through holes 30 penetrate the insulating layer 3 and the organic layer 5, simultaneously.

Figure 6:
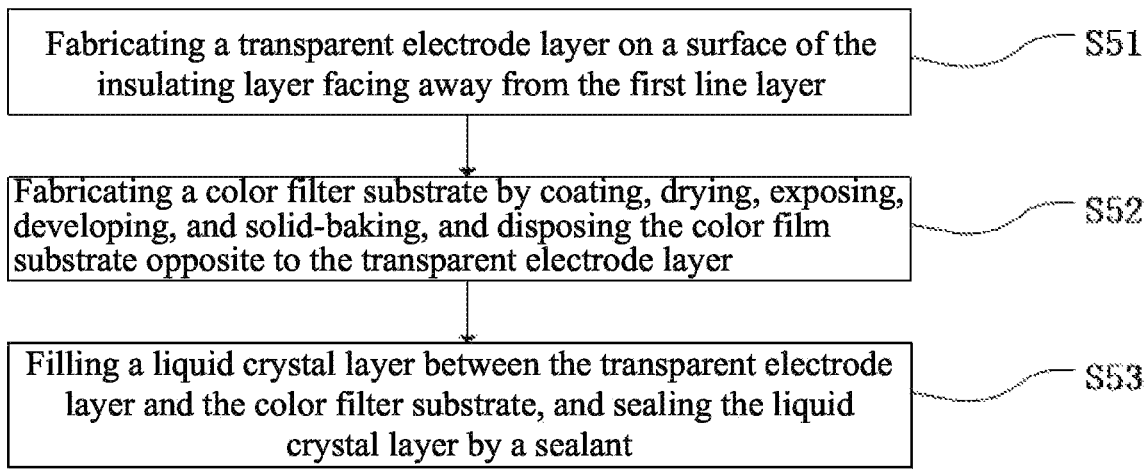
FIG. 6 is a flowchart of fabricating a display region according to an embodiment of the present disclosure.

Please referring to FIG. 6, in the present embodiment, the non-bending region 20 comprises a display region 21 configured to display. In the display region, after completing the step S4, the method further comprises steps S51-53.

In step S51, a transparent electrode layer 6 is fabricated on a surface of the insulating layer 3 facing away from the first line layer 2. Material of the transparent electrode layer 6 comprises indium tin oxide.

In step S52, a color filter substrate 8 is fabricated by coating, drying, exposing, developing, and solid-baking, and the color film substrate 8 is disposed opposite to the transparent electrode layer 6.

In step S53, a liquid crystal layer 7 is filled between the transparent electrode layer 6 and the color filter substrate 8, and the liquid crystal layer 7 is sealed by a sealant.

In the present embodiment, the non-bending region 20 comprises a binding region 22 used to bind an external circuit. In the binding region 22, after completing the step S4, the method further comprises a step of: binding a flexible circuit board 9 to the first line layer 2 to achieve electrically connecting the flexible circuit board 9 to the first line layer 2, wherein the flexible circuit board 9 includes at least one integrated circuit.

Beneficial effects of the present disclosure are that: a display panel and a method of fabricating the same are provided, wherein the second line layer is disposed on the flexible substrate in the bending region and is connected to the first line layer of a lower layer through a through hole to transmit signals. The flexible substrate may buffer stress generated by bending of the second line layer when the bending region is bent, and may improve a bending radius of the second line layer in the bending region, thereby avoiding that a local stress is excessively generated due to an excessive deformation of the second line layer, so as to generate cracks or fractures, such that the metal electrode is less likely to be broken when bent.

The above description is only a preferred embodiment of the present disclosure, and it should be noted that those skilled in the art can also make several improvements and modifications without departing from the principles of the present disclosure. These improvements and modifications should also be considered as the protective scope of the present disclosure.

What is claimed is:

1. A display panel, comprising:
   a flexible substrate having a bending region and first and second non-bending regions located at two sides of the bending region;
   a first line layer disposed on a surface of the flexible substrate and comprising a plurality of first lines, wherein each of the first lines has a first portion in the first non-bending region, a second portion in the second non-bending region, and a third portion in the bending region;
   an insulating layer disposed on a surface of the first line layer facing away from the flexible substrate, wherein with respect to each of the first lines, at least two through holes are formed and penetrate the insulating layer, and the at least two through holes are defined at positions of two ends of the bending region adjacent to the first and second non-bending regions; and a second line layer disposed on a surface of the insulating layer away from the first line layer and located in the bending region, wherein the second line layer comprises a plurality of second lines, each of the second lines is electrically connected to the third portion of the corresponding one of the first lines via the at least two through holes.

2. The display panel according to claim 1, wherein the flexible substrate comprises:
a flexible base layer; and
a buffer layer disposed on a side of the flexible layer facing towards the first line layer.

3. The display panel according to claim 2, wherein material of the flexible base layer comprises polyimide.

4. The display panel according to claim 1, wherein an organic layer is further disposed between the insulating layer and the second line layer, wherein the at least two through holes penetrate both the insulating layer and the organic layer.

5. The display panel according to claim 1, wherein the first non-bending region comprises a display region configured to display, the display region comprising:
a transparent electrode layer disposed on a surface of the insulating layer facing away from the first line layer;
a liquid crystal layer disposed on a surface of the transparent electrode layer facing away from the insulating layer; and
a color filter substrate disposed on a surface of the liquid crystal layer facing away from the transparent electrode layer, wherein the color filter substrate is connected to the transparent electrode layer by a sealant, and the liquid crystal layer is sealed.

6. The display panel according to claim 1, wherein the second non-bending region comprises a binding region configured to bind an external circuit, the binding region comprising:
a flexible circuit board electrically connected with the second portions of the first lines,
wherein the flexible circuit board comprises at least one integrated circuit.

7. A method of fabricating a display panel, comprising steps of:
providing a flexible substrate having a bending region and first and second non-bending regions located at two sides of the bending region;
fabricating a plurality of first lines on a surface of the flexible substrate to form a first line layer, wherein each of the first lines has a first portion in the first non-bending region, a second portion in the second non-bending region, and a third portion in the bending region;
fabricating an insulating layer on a surface of the first line layer facing away from the flexible substrate, and forming at least two through holes penetrating the insulating layer, wherein the at least two through holes are defined at positions of two ends of the bending region adjacent to the first and second non-bending regions; and
fabricating a plurality of second lines on a surface of the insulating layer away from the first line layer in the bending region to form a second line layer, wherein each of the second lines is electrically connected to the third portion of the corresponding one of the first lines via the at least two through holes.

8. The method of fabricating the display panel according to claim 7, wherein a step of fabricating the flexible substrate comprises:
providing a glass substrate, coating a polyimide on the glass substrate, and baking and curing the glass substrate to form the flexible substrate; and
fabricating a buffer layer on the flexible substrate.

9. The method of fabricating the display panel according to claim 7, further comprising a step of fabricating an organic layer between the step of fabricating the insulating layer and the step of fabricating the second line layer, wherein the step of fabricating the organic layer comprises:
fabricating the organic layer on a surface of the insulating layer away from the first line layer in the bending region, wherein the at least two through holes are further formed to penetrate both the insulating layer and the organic layer.

10. The method of fabricating the display panel according to claim 7, wherein the first non-bending region comprises a display region configured to display, wherein in the display region, the method further comprises steps of:
fabricating a transparent electrode layer on a surface of the insulating layer facing away from the first line layer;
fabricating a color filter substrate by coating, drying, exposing, developing, and solid-baking, and disposing the color film substrate opposite to the transparent electrode layer; and
filling a liquid crystal layer between the transparent electrode layer and the color filter substrate, and sealing the liquid crystal layer by a sealant.

* * * * *